(12) United States Patent
Nishita et al.

(10) Patent No.: US 11,009,795 B2
(45) Date of Patent: May 18, 2021

(54) AQUEOUS SOLUTION FOR RESIST PATTERN COATING AND PATTERN FORMING METHODS USING THE SAME

(71) Applicant: NISSAN CHEMICAL CORPORATION, Tokyo (JP)

(72) Inventors: Tokio Nishita, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 141 days.

(21) Appl. No.: 16/088,377

(22) PCT Filed: Mar. 21, 2017

(86) PCT No.: PCT/JP2017/011230
§ 371 (c)(1),
(2) Date: Sep. 25, 2018

(87) PCT Pub. No.: WO2017/169981
PCT Pub. Date: Oct. 5, 2017

(65) Prior Publication Data
US 2019/0243249 A1 Aug. 8, 2019

(30) Foreign Application Priority Data
Mar. 30, 2016 (JP) .............................. JP2016-069086

(51) Int. Cl.
*G03F 7/20* (2006.01)
*G03F 7/40* (2006.01)
*H01L 21/027* (2006.01)
*G03F 7/00* (2006.01)

(52) U.S. Cl.
CPC .......... *G03F 7/2043* (2013.01); *G03F 7/0035* (2013.01); *G03F 7/40* (2013.01); *G03F 7/405* (2013.01); *H01L 21/027* (2013.01); *H01L 21/0275* (2013.01)

(58) Field of Classification Search
CPC ... C09D 7/20; C09D 7/63; C09D 7/65; C09D 171/02; H01L 21/027; H01L 21/0271; H01L 21/0273; H01L 21/0275; G03F 7/0035; G03F 7/20; G03F 7/2043; G03F 7/30; G03F 7/40; G03F 7/405; G03F 7/42
See application file for complete search history.

(56) References Cited

U.S. PATENT DOCUMENTS

| | | | | |
|---|---|---|---|---|
| 6,508,887 B1* | 1/2003 | Park | .......................... | C11D 3/32 134/1.3 |
| 6,730,239 B1* | 5/2004 | Kanno | ................... | C09K 13/02 134/1.2 |
| 2002/0030796 A1* | 3/2002 | Anderson | .............. | G03B 27/00 355/18 |
| 2003/0029994 A1* | 2/2003 | Jung | ....................... | G01N 21/76 250/283 |
| 2005/0282718 A1* | 12/2005 | Nakagawa | ............... | C11D 3/37 510/175 |
| 2008/0248427 A1* | 10/2008 | Thiyagarajan | ....... | C09D 139/00 430/287.1 |
| 2010/0143721 A1* | 6/2010 | Chen | ..................... | C01G 49/009 428/407 |
| 2012/0156879 A1* | 6/2012 | Kozawa | ............ | H01L 21/76802 438/694 |
| 2013/0171574 A1* | 7/2013 | Xu | ............................ | G03F 7/38 430/325 |
| 2014/0186772 A1* | 7/2014 | Pohlers | ................. | G03F 7/0397 430/311 |
| 2015/0185620 A1* | 7/2015 | Liu | ........................ | G03F 7/0392 430/319 |
| 2017/0293227 A1* | 10/2017 | Nishita | ............. | H01L 21/02118 |

FOREIGN PATENT DOCUMENTS

| | | |
|---|---|---|
| JP | 2001-281886 A | 10/2001 |
| JP | 2004-219577 A | 8/2004 |
| JP | 2006-060006 A | 3/2006 |
| JP | 2010-049247 A | 3/2010 |
| JP | 2011-257499 A | 12/2011 |
| JP | 2012-141564 A | 7/2012 |

(Continued)

OTHER PUBLICATIONS

Sigma Aldrich Poly(ethylene glycol)block-poly(propylene glycol)-block-poly(ethylene glycol), 2020 (Year: 2020).*
Jun. 20, 2017 International Search Report issued in International Patent Application No. PCT/JP2017/011230.
Jun. 20, 2017 Written Opinion of the International Searching Authority issued in International Patent Application No. PCT/JP2017/011230.
Feb. 5, 2020 Office Action issued in Japanese Patent Application No. 2018-509091.
Oct. 16, 2020 Office Action issued in Taiwanese Patent Application No. 106110570.

*Primary Examiner* — Anca Eoff
(74) *Attorney, Agent, or Firm* — Oliff PLC

(57) ABSTRACT

A novel aqueous solution for resist pattern coating. An aqueous solution for resist pattern coating, including: a copolymer as component A, the copolymer having an ethylene oxide unit and a $C_3$ alkylene oxide unit in a main chain and having a hydroxy group at a terminal; a water-soluble polymer, a water-soluble monomer, or a water-soluble oligomer as component B, the water-soluble polymer being other than the copolymer as the component A; and a solvent as component C, the solvent containing water as a main component. The copolymer as the component A is for example a block copolymer of formula (1) below:

$$HO\text{-}(R_1O)_x\text{-}(R_2O)_y\text{-}(R_3O)_z\text{-}H \qquad (1)$$

wherein $R_1$, $R_2$, and $R_3$ are each independently an ethylene group, a propylene group, or a trimethylene group, and x, y, and z are each independently an integer of 5 to 100.

4 Claims, No Drawings

(56) References Cited

FOREIGN PATENT DOCUMENTS

| | | |
|---|---|---|
| JP | 2013-145290 A | 7/2013 |
| WO | 2015/025665 A1 | 2/2015 |
| WO | WO 2016/043317 * | 3/2016 |
| WO | 2016/190261 A1 | 12/2016 |

* cited by examiner

AQUEOUS SOLUTION FOR RESIST PATTERN COATING AND PATTERN FORMING METHODS USING THE SAME

The present application is a U.S. national stage application of PCT/JP2017/011230 filed Mar. 21, 2017, incorporated herein by reference.

TECHNICAL FIELD

The present invention relates to an aqueous solution for resist pattern coating that is capable of preventing collapse of a resist pattern and enabling refinement of the resist pattern. The present invention further relates to a pattern forming method and an inverted pattern forming method using the aqueous solution.

BACKGROUND ART

Semiconductor devices are manufactured through microfabrication based on lithography using a resist composition. The microfabrication is a processing method consisting of forming a thin layer of a photoresist composition on a semiconductor substrate such as a silicon wafer; exposing the thin layer of the photoresist composition to activating light such as ultraviolet light through a mask pattern on which a pattern of a device is drawn; developing the exposed layer; and etching the substrate with the resulting photoresist pattern serving as a protective layer to form, on a surface of the substrate, microscopic projections and depressions corresponding to the pattern. In recent years, the degree of integration of semiconductor devices has become higher and higher, and the activating light used has been shifted from i-line light (wavelength: 365 nm) or KrF excimer laser light (wavelength: 248 nm) to shorter-wavelength light, in particular ArF excimer laser light (wavelength: 193 nm). At present, a new microfabrication technique, lithography employing EUV (abbreviation for extreme ultraviolet; wavelength: 13.5 nm) exposure, is under consideration. However, lithography employing EUV exposure has not been put into practice (for mass production) because, for example, development of high-power EUV light sources has been delayed.

A method of enabling refinement of a resist pattern by applying a coating on the resist pattern and a coating material used for this purpose have also been known (Patent Documents 1 to 4, for example). With the use of this method, a resist pattern formed by the existing lithography employing exposure to ArF excimer laser light can be made finer.

PRIOR ART DOCUMENTS

Patent Documents

Patent Document 1: Japanese Patent Application Publication No. 2001-281886
Patent Document 2: Japanese Patent Application Publication No. 2010-49247
Patent Document 3: Japanese Patent Application Publication No. 2011-257499
Patent Document 4: Japanese Patent Application Publication No. 2013-145290

SUMMARY OF THE INVENTION

Problem to be Solved by the Invention

The aqueous solution described in Patent Document 1, which contains a water-soluble resin, is disadvantageous in terms of coating properties on resist patterns since the solvent used in this aqueous solution is water having a higher surface tension than organic solvents. Thus, addition of a surfactant or mixing of a water-soluble alcohol with water is required. The composition for resist pattern refinement which is described in Patent Document 2 is in the form of a solution free of polymers; thus, the degree to which a resist pattern is refined is likely to vary depending on the shape of the resist pattern to be refined. The treatment agent for pattern refinement which is described in Patent Document 3 contains a component acting as an acid generator, and it is necessary to carry out bake treatment at a temperature of 130° C. or higher after application of the treatment agent for pattern refinement or add an exposure step subsequent to application of the treatment agent for pattern refinement. The fine pattern forming method described in Patent Document 4 consists in narrowing a resist pattern formed by a negative development process, namely reducing the space width which is the distance between lines of the resist pattern by forming a coating layer on the resist pattern and then heating the resist pattern. Thus, the fine pattern forming method is not intended to reduce the width or diameter of resist patterns.

The present invention has been made to solve the above problems, and an object of the present invention is to provide an aqueous solution for resist pattern coating that exhibits good coating properties by being applied onto a resist pattern undried after development and rinsing treatments and that is capable of preventing collapse of the resist pattern by reducing the Laplace force acting over the spaces in the resist pattern. Another object of the present invention is to provide an aqueous solution for resist pattern coating that contains an acidic additive and is thus capable of reducing the width of a resist pattern. Still another object of the present invention is to provide a method of forming a resist pattern using the aqueous solution and a method of forming an inverted pattern using the aqueous solution.

Means for Solving the Problem

As a result of intensive investigations aimed at achieving the above objects, the present inventors have discovered an aqueous solution for resist pattern coating that enables formation of finer patterns than conventional compositions for fine pattern formation and allows easy control of the degree of reduction in pattern size. It has also been found that, since water and optionally a particular water-soluble organic solvent such as isopropyl alcohol are used as the solvent of the aqueous solution, the aqueous solution is highly compatible with other solutions (such as a developing solution and a rinsing solution containing a surfactant) used in a typical developing cup provided in a coater/developer and can thus be used in such a developing cup.

The first aspect of the present invention is an aqueous solution for resist pattern coating, comprising: a copolymer as component A, the copolymer having an ethylene oxide unit and a $C_3$ alkylene oxide unit in a main chain and having a hydroxy group at a terminal; a water-soluble polymer, a water-soluble monomer, or a water-soluble oligomer as component B, the water-soluble polymer being other than the copolymer as the component A; and a solvent as component C, the solvent containing water as a main component.

For example, the copolymer as the component A is a block copolymer of formula (1) below:

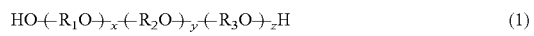

(1)

(wherein $R_1$, $R_2$, and $R_3$ are each independently an ethylene group, a propylene group, or a trimethylene group, and x, y, and z are each independently an integer of 5 to 100).

For example, the copolymer as the component A has a number-average molecular weight of 1000 to 20,000.

For example, the water-soluble polymer as the component B has a number-average molecular weight of 1000 to 400,000 and is polyvinylpyrrolidone, polyacrylic acid, polyacrylamide, polyvinyl alcohol, polysaccharide, polyamino acid, polyethyleneimine, or polyethylene glycol, and the water-soluble monomer or water-soluble oligomer as the component B is, for example, cyclodextrin or crown ether.

The solvent as the component C optionally contains at least one water-soluble organic solvent selected from the group consisting of alcohols, esters, ethers, and ketones.

The aqueous solution for resist pattern coating according to the first aspect of the present invention may further comprise an organic sulfonic acid of formula (2) below as component D:

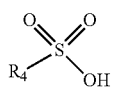

(2)

(wherein $R_4$ is a linear, branched, or cyclic alkyl group or fluoroalkyl group having a carbon atom number of 1 to 16, or an aromatic group having at least one of the alkyl group or the fluoroalkyl group as a substituent, the cyclic alkyl group optionally has carbonyl group in a main chain, and the aromatic group optionally further has a hydroxy group or a carboxyl group as a substituent).

In the formula (2), $R_4$ is, for example, a phenyl or naphthyl group having a linear alkyl group having a carbon atom number of 10 to 16 as a substituent.

The content of the organic sulfonic acid as the component D is, for example, 0.01% by mass to 70% by mass relative to 100% by mass of the total amount of the component A and the component B.

The number-average molecular weight of the copolymer as the component A and the number-average molecular weight of the water-soluble polymer as the component B are those measured by gel permeation chromatography. The measurement is carried out using a GPC apparatus available from Tosoh Corporation, and the measurement conditions are as follows.

GPC Column: Shodex (registered trademark) Asahipak (registered trademark) (available from Showa Denko K.K.)
Column Temperature: 40° C.
Solvent: N,N-dimethylformamide (DMF)
Flow Rate: 0.6 mL/min
Standard Samples: Standard polystyrene sample (manufactured by Tosoh Corporation) and standard polyethylene oxide (PEO) sample (manufactured by Showa Denko K.K.)
Detector: RI detector (RI-8020, manufactured by Tosoh Corporation)

A second aspect of the present invention is a pattern forming method comprising: a step of forming a resist pattern by subjecting a resist layer formed on a resist underlayer film on a substrate to exposure, baking, development treatment with a developing solution, and rinsing treatment with a rinsing solution in accordance with a lithography process; a step of applying the aqueous solution for resist pattern coating according to the first aspect of the present invention to coat the resist pattern without drying the resist pattern after the rinsing treatment; and a step of forming a coating layer on a surface of the resist pattern by heating the substrate with the applied aqueous solution for resist pattern coating at 50° C. to 130° C.

The pattern forming method according to the second aspect of the present invention optionally comprises a step of, after forming the coating layer, cooling the substrate and then removing the coating layer by etching the coating layer with an etching gas.

The pattern forming method according to the second aspect of the present invention optionally comprises: a step of, after forming the coating layer, cooling the substrate and then subjecting the coating layer to development treatment with a developing solution; and a step of subjecting the resist pattern to rinsing treatment with a rinsing solution after subjecting the coating layer to the development treatment.

A third aspect of the present invention is an inverted pattern forming method comprising: a step of forming a resist pattern by subjecting a resist layer formed on a resist underlayer film on a substrate to exposure, baking, development treatment with a developing solution, and rinsing treatment with a rinsing solution in accordance with a lithography process; a step of applying the aqueous solution for resist pattern coating according to the first aspect of the present invention to coat the resist pattern without drying the resist pattern after the rinsing treatment; a step of forming a coating layer on a surface of the resist pattern by heating the substrate with the applied aqueous solution for resist pattern coating at 50° C. to 130° C.; a step of, after forming the coating layer, cooling the substrate and then subjecting the coating layer to development treatment with a developing solution; a step of applying a application solution for filling to fill pattern spaces in the resist pattern after subjecting the coating layer to the development treatment, the application solution for filling including a polysiloxane and a solvent containing water and/or an alcohol; a step of forming an applied layer by removing, or reducing the amounts of, the developing solution and a component of the application solution for filling other than the polysiloxane; a step of uncovering a top surface of the resist pattern by etching back the applied layer; and a step of removing the resist pattern with the top surface uncovered.

The inverted pattern forming method optionally further comprises a step of subjecting the resist pattern to rinsing treatment with a rinsing solution after subjecting the coating layer to the development treatment and, after this step, the step of applying the application solution for filling is optionally performed without drying the resist pattern.

Effects of the Invention

The aqueous solution for resist pattern coating according to the present invention can be spread uniformly over a line-shaped and/or pillar-shaped resist pattern formed on a substrate when the aqueous solution for resist pattern coating is applied without drying the resist pattern after subjecting the resist layer to exposure, development treatment, and rinsing treatment. Furthermore, by applying the aqueous solution for resist pattern coating according to the present invention without drying the resist pattern after development treatment and rinsing treatment, it is made possible to control the Laplace force acting over the spaces in the resist pattern and thus prevent collapse of the resist pattern. Furthermore, since water and optionally a particular water-soluble organic solvent such as isopropyl alcohol are used as the solvent, the aqueous solution for resist pattern coating according to the present invention is highly compatible with other solutions (such as a developing solution and a rinsing solution containing a surfactant) used in a typical developing cup provided in a coater/developer and can thus be used in such a developing cup.

When containing an acidic additive, the aqueous solution for resist pattern coating according to the present invention makes it possible, in a line and space pattern in which the ratio between the line pattern width and the space pattern width varies, to uniformly reduce the line pattern width. Furthermore, the degree of reduction in the width or diameter of the resist pattern can be changed depending on selection of the polymer contained in the aqueous solution for resist pattern coating according to the present invention. Additionally, if EUV exposure is put into practice in the future, a resist pattern fabricated by EUV exposure can be made finer.

MODES FOR CARRYING OUT THE INVENTION

Component A

The component A contained in the aqueous solution for resist pattern coating according to the present invention is a copolymer having an ethylene oxide unit and a $C_3$ alkylene oxide unit in a main chain and having a hydroxy group at a terminal. Examples of such a copolymer include Adeka (registered trademark) Pluronic L-23, L-31, L-44, L-61, L-62, L-64, L-71, L-72, L-101, L-121, P-84, P-85, P-103, F-68, F-88, F-108, 25R-1, 25R-2, 17R-2, 17R-3, and 17R-4 (all of which are manufactured by Adeka Corporation).

The content of the component A contained in the aqueous solution for resist pattern coating according to the present invention is, for example, 0.05% by mass to 30% by mass, preferably 0.1% by mass to 10% by mass, relative to 100% by mass of the total aqueous solution.

Component B

The component B contained in the aqueous solution for resist pattern coating according to the present invention is a water-soluble polymer other than the copolymer as the component A, a water-soluble monomer, or a water-soluble oligomer. Specific examples of the water-soluble polymer, water-soluble monomer, and water-soluble oligomer include the compounds mentioned above.

The content of the component B contained in the aqueous solution for resist pattern coating according to the present invention is, for example, 0.05% by mass to 30% by mass, preferably 0.1% by mass to 10% by mass, relative to 100% by mass of the total aqueous solution.

Component C

The component C contained in the aqueous solution for resist pattern coating according to the present invention is a solvent containing water as a main component. The water concentration in the solvent containing water as a main component is, for example, 51% by mass to 100% by mass or 80% by mass to 100% by mass. A water concentration of 100% by mass means that the solvent containing water as a main component consists of water. When the solvent contains a component other than water, the component other than water is at least one water-soluble organic solvent selected from the group consisting of alcohols, esters, ethers, and ketones.

Examples of the alcohol include: alcohols such as ethyl alcohol, n-propyl alcohol, isopropyl alcohol, n-butyl alcohol, sec-butyl alcohol, n-hexyl alcohol, and n-heptyl alcohol; glycol solvents such as ethylene glycol, propylene glycol, and diethylene glycol; and glycol ether solvents such as ethylene glycol monomethyl ether, propylene glycol monomethyl ether, diethylene glycol monomethyl ether, triethylene glycol monoethyl ether, and methoxymethylbutanol.

Examples of the ester include ethyl acetate, n-propyl acetate, isopropyl acetate, n-butyl acetate, propylene glycol monomethyl ether acetate, ethylene glycol monoethyl ether acetate, diethylene glycol monobutyl ether acetate, diethylene glycol monoethyl ether acetate, 3-methoxybutyl acetate, 3-methyl-3-methoxybutyl acetate, butyl lactate, and propyl lactate.

Examples of the ether include the glycol ether solvents mentioned above and further include di-n-propyl ether, di-n-butyl ether, dioxane, and tetrahydrofuran.

Examples of the ketone include 1-octanone, 2-octanone, 1-nonanone, 2-nonanone, 4-heptanone, 1-hexanone, 2-hexanone, diisobutyl ketone, cyclohexanone, methyl ethyl ketone, methyl isobutyl ketone, and acetophenone.

Component D

The aqueous solution for resist pattern coating according to the present invention may further comprise an organic sulfonic acid represented by the formula (2) above as component D. Examples of such an organic sulfonic acid include octylbenzenesulfonic acid, nonylbenzenesulfonic acid, decylbenzenesulfonic acid, undecylbenzenesulfonic acid, dodecylbenzenesulfonic acid (also called laurylbenzenesulfonic acid), (1,3,5,7-tetramethyloctyl)benzenesulfonic acid, tridecylbenzenesulfonic acid, (1R)-(−)-10-camphorsulfonic acid, (1S)-(+)-10-camphorsulfonic acid, trifluoromethanesulfonic acid, perfluorobutanesulfonic acid, perfluorooctanesulfonic acid, nonafluoro-1-butanesulfonic acid, p-toluenesulfonic acid, and 1-naphthalenesulfonic acid. Among these organic sulfonic acids, dodecylbenzenesulfonic acid and nonafluoro-1-butanesulfonic acid are preferably used as the component (D) contained in the aqueous solution for resist pattern coating according to the present invention.

When the aqueous solution for resist pattern coating according to the present invention comprises the component D, the content of the component D is, for example, 0.01% by mass to 70% by mass, preferably 0.1% by mass to 50% by mass, relative to 100% by mass of the total amount of the component A and the component B.

Other Additives

The aqueous solution for resist pattern coating according to the present invention may, if desired, further comprise various additives such as a surfactant as long as the effect of the present invention is not impaired. The surfactant is an additive for improving the coating properties of the aqueous solution on a substrate. Known surfactants such as nonionic surfactants and fluorosurfactants can be used.

Specific examples of the surfactant include nonionic surfactants including: polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenyl ether and polyoxyethylene nonyl phenyl ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate. Other examples of the surfactant include: fluorosurfactants such as Eftop (registered trademark) EF301, EF303, and EF352 (manufactured by Mitsubishi Materials Electronic Chemicals Co., Ltd.), Megafac (registered trademark) F171, F173, R-30, R-40, and R-40-LM (manufactured by DIC Corporation), Fluorad FC430 and FC431 (manufactured by Sumitomo 3M Limited), AsahiGuard (registered trademark) AG710 (manufactured by Asahi Glass Co., Ltd.), Surflon (registered trademark) S-382, SC101, SC102, SC103, SC104, SC105, and SC106 manufactured by Asahi Glass Co., Ltd.); and organosiloxane polymer KP341 (manufactured by Shin-Etsu Chemical Co., Ltd.). These surfactants may be added alone, or two or more thereof may be added in combination.

When the aqueous solution for resist pattern coating according to the present invention comprises the surfactant, the content of the surfactant is, for example, 0.1% by mass to 5% by mass, preferably 0.2% by mass to 3% by mass, relative to 100% by mass of the total amount of the component A and the component B.

Pattern Forming Method and Inverted Pattern Forming Method

A pattern forming method and an inverted pattern forming method using the aqueous solution for resist pattern coating according to the present invention comprise a step of forming a resist pattern by subjecting a resist layer formed on a resist underlayer film on a substrate to exposure, baking, development treatment with a developing solution, and rinsing treatment with a rinsing solution in accordance with a lithography process. Examples of the substrate include substrates used for manufacturing of precision integrated circuit devices (specific examples include: semiconductor substrates such as silicon wafers which are optionally coated with a silicon oxide layer, silicon nitride layer, or silicon oxynitride layer; silicon nitride substrates; quartz substrates; alkali-free glass substrates; low-alkali glass substrates; crystallized glass substrates; and glass substrates on which an ITO layer is formed). On the substrate, an organic layer and/or inorganic layer having anti-reflective property is formed as a resist underlayer film. A resist solution that can be used to form a resist layer on the resist underlayer film on the substrate is a positive resist solution (examples of which include PAR710 and PAR855 manufactured by Sumitomo Chemical Company, Limited and AR2772JN manufactured by JSR Corporation). A negative resist solution may be used instead of the positive resist solution.

The light source employed in the exposure device used for exposure of the resist layer can be, for example, radiation selected from the group consisting of i-line radiation, KrF excimer laser radiation, ArF excimer laser radiation, and EUV. The heating temperature in baking of the exposed resist layer (post exposure bake, abbreviated as PEB) is, for example, 80° C. to 140° C.

When a positive resist solution is used for formation of the resist layer, the developing solution used in the development treatment may be an aqueous solution of an alkali, examples of which include: inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline; cyclic amines such as pyrrole and piperidine. Such an aqueous alkali solution further containing an appropriate amount of added alcohol such as isopropyl alcohol or added surfactant such as a nonionic surfactant can also be used. Preferred developing solutions among the above aqueous solutions are aqueous solutions of quaternary ammonium salts, and a more preferred developing solution is an aqueous solution of tetramethylammonium hydroxide.

Examples of the shape of the resist pattern to be formed include a line shape and a pillar shape. When a line-shaped resist pattern is formed, the resist pattern formed may be either an isolated line pattern or a line and space pattern. The line-shaped resist pattern is not limited to being straight and may be curved.

Examples of the rinsing solution used in the rinsing treatment include an aqueous solution containing a surfactant, pure water, and ultrapure water.

The pattern forming method and inverted pattern forming method using the aqueous solution for resist pattern coating according to the present invention further comprise a step of applying the aqueous solution for resist pattern coating according to the present invention to coat the resist pattern after the rinsing treatment. In this step, it is important to avoid drying the resist pattern. This is because drying the resist pattern may cause collapse of the resist pattern.

When a coating layer formed on the surface of the resist pattern is then etched with an etching gas or subjected to development treatment with a developing solution, the etching gas may be, for example, a mixed gas of $O_2$ and $N_2$, $O_2$ gas, $CF_4$ gas, $Cl_2$ gas, HBr gas, $SiF_4$ gas, HCl gas, He gas, or Ar gas, and the developing solution used can be the aqueous alkali solution as described above. The rinsing solution used in the rinsing treatment subsequent to the development treatment can be any of the specific examples mentioned above.

Application Solution for Filling

The inverted pattern forming method using the aqueous solution for resist pattern coating according to the present invention comprises a step of applying a application solution for filling to fill the pattern spaces in the resist pattern, the application solution for filling including a polysiloxane and a solvent containing water and/or an alcohol. The polysiloxane used as a component of the application solution for filling can be a known material for use in solutions to be applied to resist patterns. The alcohol used can be any of the specific examples of the alcohol that the component C may contain as a component other than water.

The inverted pattern forming method using the aqueous solution for resist pattern coating according to the present invention further comprises a step of forming an applied layer by removing, or reducing the amounts of, the developing solution or rinsing solution and a component of the application solution for filling other than the polysiloxane. This step consists in, for example, subjecting the substrate with the applied application solution for filling to spin drying and optionally heating the substrate after the spin drying. The spin drying refers to drying the substrate being rotated. The component of the application solution for filling other than the polysiloxane includes a polysiloxane, the solvent containing water and/or an alcohol, and an additive added if necessary.

The inverted pattern forming method using the aqueous solution for resist pattern coating according to the present invention further comprises a step of uncovering a top surface of the resist pattern by etching back the applied layer and a step of removing the resist pattern with the top surface uncovered. The etching back can be accomplished, for example, by dry etching using a fluorinated gas such as $CF_4$, wet etching using an aqueous solution of an organic acid or organic base, wet etching using an organic solvent, or CMP. The conditions of this treatment can be adjusted as appropriate. The removal of the resist pattern with the top surface uncovered is accomplished, for example, by dry etching using a mixed gas of $O_2$ and $N_2$ or $O_2$ gas.

EXAMPLES

Hereinafter, the present invention will be described with reference to synthesis examples and examples. The present invention is not limited by the following description.

Example 1

0.50 g of polyvinylpyrrolidone K60 (an aqueous solution with a concentration of about 35%; manufactured by Tokyo Chemical Industry Co., Ltd.) and 0.08 g of polyoxyethylene polyoxypropylene glycol (160E.O.) (30P.O.) (manufactured by Wako Pure Chemical Industries, Ltd.) were added and dissolved in 49.42 g of pure water. The resulting solution was then filtered through a microfilter having a pore diameter of 0.20 μm (manufactured by GE Healthcare Japan Corporation, formerly Whatman Japan K.K.) to prepare an aqueous solution for resist pattern coating.

Example 2

0.36 g of polyvinylpyrrolidone K60 (an aqueous solution with a concentration of about 35%; manufactured by Tokyo Chemical Industry Co., Ltd.) and 0.12 g of polyoxyethylene polyoxypropylene glycol (160E.O.) (30P.O.) (manufactured by Wako Pure Chemical Industries, Ltd.) were added and dissolved in 49.52 g of pure water. The resulting solution was then filtered through a microfilter having a pore diameter of 0.20 μm (manufactured by GE Healthcare Japan Corporation, formerly Whatman Japan K.K.) to prepare an aqueous solution for resist pattern coating.

Example 3

0.21 g of polyvinylpyrrolidone K60 (an aqueous solution with a concentration of about 35%; manufactured by Tokyo Chemical Industry Co., Ltd.) and 0.18 g of polyoxyethylene polyoxypropylene glycol (160E.O.) (30P.O.) (manufactured by Wako Pure Chemical Industries, Ltd.) were added and dissolved in 49.61 g of pure water. The resulting solution was then filtered through a microfilter having a pore diameter of 0.20 μm (manufactured by GE Healthcare Japan Corporation, formerly Whatman Japan K.K.) to prepare an aqueous solution for resist pattern coating.

Example 4

1.48 g of polyvinylpyrrolidone K60 (an aqueous solution with a concentration of about 35%; manufactured by Tokyo Chemical Industry Co., Ltd.), 0.058 g of polyoxyethylene polyoxypropylene glycol (160E.O.) (30P.O.) (manufactured by Wako Pure Chemical Industries, Ltd.), and 0.17 g of dodecylbenzenesulfonic acid (manufactured by Wako Pure Chemical Industries, Ltd.) were added and dissolved in 48.29 g of pure water. The resulting solution was then filtered through a microfilter having a pore diameter of 0.20 μm (manufactured by GE Healthcare Japan Corporation, formerly Whatman Japan K.K.) to prepare an aqueous solution for resist pattern coating.

Example 5

1.38 g of polyvinylpyrrolidone K60 (an aqueous solution with a concentration of about 35%; manufactured by Tokyo Chemical Industry Co., Ltd.), 0.054 g of polyoxyethylene polyoxypropylene glycol (160E.O.) (30P.O.) (manufactured by Wako Pure Chemical Industries, Ltd.), and 0.21 g of dodecylbenzenesulfonic acid (manufactured by Wako Pure Chemical Industries, Ltd.) were added and dissolved in 48.35 g of pure water. The resulting solution was then filtered through a microfilter having a pore diameter of 0.20 μm (manufactured by GE Healthcare Japan Corporation, formerly Whatman Japan K.K.) to prepare an aqueous solution for resist pattern coating.

Example 6

1.71 g of polyvinylpyrrolidone K60 (an aqueous solution with a concentration of about 35%; manufactured by Tokyo Chemical Industry Co., Ltd.), 0.067 g of polyoxyethylene polyoxypropylene glycol (160E.O.) (30P.O.) manufactured by Wako Pure Chemical Industries, Ltd.), and 0.33 g of dodecylbenzenesulfonic acid (manufactured by Wako Pure Chemical Industries, Ltd.) were added and dissolved in 49.47 g of pure water. The resulting solution was then filtered through a microfilter having a pore diameter of 0.20 μm (manufactured by GE Healthcare Japan Corporation, formerly Whatman Japan K.K.) to prepare an aqueous solution for resist pattern coating.

Comparative Example 1

0.2 g of polyvinylpyrrolidone K60 (an aqueous solution with a concentration of about 35%; manufactured by Tokyo Chemical Industry Co., Ltd.) was added and dissolved in 49.0 g of pure water. The resulting solution was then filtered through a microfilter having a pore diameter of 0.20 μm (manufactured by GE Healthcare Japan Corporation, formerly Whatman Japan K.K.) to prepare an aqueous solution for resist pattern coating.

Comparative Example 2

0.5 g of polyoxyethylene polyoxypropylene glycol (160E.O.) (30P.O.) (manufactured by Wako Pure Chemical Industries, Ltd.) was added and dissolved in 45.0 g of pure water. The resulting solution was then filtered through a microfilter having a pore diameter of 0.20 μm (manufactured by GE Healthcare Japan Corporation, formerly Whatman Japan K.K.) to prepare an aqueous solution for resist pattern coating.

Testing of Coating Properties on Silicon Wafer

Pure water was further added to each of the aqueous solutions for resist pattern coating which were prepared in Examples 1 to 3, Comparative Example 1, and Comparative Example 2, and the solution was applied onto a silicon wafer with a spin coater (1500 rpm, 60 seconds) to have a thickness of 10 nm. The silicon wafer was baked at 100° C. for 60 seconds. Thereafter, the applied layer on the silicon wafer was inspected to evaluate the coating properties of each aqueous solution for resist pattern coating on the silicon wafer. The results are shown in Table 1 below.

TABLE 1

|  | Coating Properties on Silicon Wafer |
|---|---|
| Example 1 | Good |
| Example 2 | Good |
| Example 3 | Good |
| Comparative Example 1 | Coating Failure |
| Comparative Example 2 | Coating Failure |

Formation of Photoresist Pattern

ARC (registered trademark) 29A manufactured by Nissan Chemical Industries, Ltd.) was applied onto a silicon wafer with a spinner. The silicon wafer was placed on a hot plate and heated at 205° C. for 1 minute to form an 80-nm-thick resist underlayer film. A commercially-available photoresist solution (manufactured by Sumitomo Chemical Company, Limited under the trade name "PAR855") was applied onto the resist underlayer film with a spinner, and this was followed by heating on a hot plate at 105° C. for 60 seconds, thus forming a photoresist layer (thickness: 0.10 μm).

Next, a scanner (NSR-S307E, manufactured by Nikon Corporation; wavelength: 193 nm, NA: 0.85, σ: 0.65/0.93) was used to expose the photoresist layer through a photomask. The photomask was selected depending on the resist pattern to be formed. The exposure was followed by post exposure bake (PEB) on a hot plate at 105° C. for 60 seconds. After cooling, development treatment was performed in accordance with industrially standardized 60-second single paddle process using a 0.26 N aqueous solution of tetramethylammonium hydroxide as a developing solution. Thereafter, pure water was applied, and rinsing was performed to remove the developing solution. The rinsing was followed by spin drying. Through the above steps, the intended resist pattern was formed. For the line and space pattern thus formed, the line pattern width was measured, and the occurrence of pattern collapse was examined.

Resist patterns as obtained through the above steps were observed from above with CD-SEM S-9380II (manufactured by Hitachi High-Technologies Corporation) to obtain a top view image of each resist pattern, and the dimensions of the resist pattern were measured. A pattern with a line-to-space ratio of 1:1 (amount of exposure: 37 mJ/cm$^2$) was used as Reference 1, and a collapsed resist pattern (amount of exposure: 64 mJ/cm$^2$) was used as Reference 2. To investigate the effect on prevention of collapse of the resist patterns, each resist pattern formed on the silicon wafer was subjected to a step of applying the aqueous solution for resist pattern coating as prepared in Example 2 with a spin coater (1500 rpm, 60 seconds) to coat the resist pattern before drying the resist pattern after exposure, development, and rinsing treatment, and this step was followed by baking at 100° C. for 60 seconds to form a coating layer. For the line and space pattern on which the coating layer was formed, the line pattern width and the roughness (LWR) were measured, and the occurrence of pattern collapse was examined. The LWR is the abbreviation for "line width roughness". The results are shown in Table 2 below. By comparison between Reference 1 and the resist pattern on which a coating layer was formed using the aqueous solution for resist pattern coating according to Example 2, it was observed that the resist pattern width was increased by 2 nm after formation of the coating layer. This confirmed that the coating layer was formed on the surface of the resist pattern. Comparison between Reference 2 and the resist pattern on which a coating layer was formed using the aqueous solution for resist pattern coating according to Example 2 reveals that the formation of the coating layer can prevent resist pattern collapse.

TABLE 2

|  | Reference 1 | With Use of Aqueous Solution for Resist Pattern Coating According to Example 2 | Reference 2 | With Use of Aqueous Solution for Resist Pattern Coating According to Example 2 |
|---|---|---|---|---|
| Pattern Shape | Good | Good | Collapsed | Good |
| Amount of Exposure/(mJ/cm$^2$) | 37 | 37 | 64 | 64 |
| Line Pattern Width/nm | 64 | 66 | — | 37 |
| Roughness (LWR)/nm | 5.4 | 5.3 | — | 3.7 |

Testing of Refinement of Resist Pattern

An EUV resist was applied to have a thickness of 30 nm on a silicon wafer treated with hexamethyldisilazane (HMDS) at 120° C. for 60 seconds, followed by baking. Thereafter, a silicon wafer having a resist layer on which a line and space pattern was drawn by using an electron beam lithography system manufactured by Elionix Inc. The produced silicon wafer was cut into the shape of a chip and then subjected to development treatment using a 0.26 N aqueous solution of tetramethylammonium hydroxide as a developing solution. Thereafter, pure water was applied, and rinsing was performed to remove the developing solution. The rinsing was followed by drying on a hot plate at 100° C. for 30 seconds. Thus, a pattern with a line-to-space ratio of 1:1 was obtained as a reference. Additionally, a chip-shaped silicon wafer as produced according to the above production procedures was subjected to development treatment with the above developing solution. Subsequently, the silicon wafer was rinsed with pure water to remove the developing solution. Each of the aqueous solutions for resist pattern coating as prepared in Examples 4 to 6 was applied onto an undried resist pattern as obtained after the development and rinsing treatment. This was followed by baking at 80° C. for 60 seconds to form a coating layer. The coating layer was then developed with a developing solution, and the resist pattern resulting from the development of the coating layer with the developing solution was rinsed with a rinsing solution and then dried at 100° C. for 30 minutes. The width of each of the line patterns thus trimmed was measured. The results are shown in Table 3. The results shown in Table 3 indicate that the patterns obtained by forming coating layers with aqueous solutions for resist pattern coating according to Examples 4 to 6 and then performing development, rinsing treatment, and drying had a line pattern width that was smaller by 5 nm or more than the pattern as a reference.

TABLE 3

| | Reference | With Use of Aqueous Solution for Resist Pattern Coating According to Example 4 | With Use of Aqueous Solution for Resist Pattern Coating According to Example 5 | With Use of Aqueous Solution for Resist Pattern Coating According to Example 6 |
|---|---|---|---|---|
| Pattern Shape | Good | Good | Good | Good |
| Line Pattern Width/nm | 35.8 | 29.9 | 29.6 | 28.0 |
| Amount of Trimming/nm | — | 5.9 | 6.2 | 7.8 |

The invention claimed is:

1. A pattern forming method comprising:
a step of forming a resist pattern by subjecting a resist layer formed on a resist underlayer film on a substrate to exposure, baking, development treatment with a developing solution, and rinsing treatment with a rinsing solution;
a step of applying an aqueous solution for resist pattern coating to coat the resist pattern without drying the resist pattern after the rinsing treatment, wherein the aqueous solution for resist pattern coating comprises:
a copolymer as component A, the copolymer having an ethylene oxide unit and a $C_3$ alkylene oxide unit in a main chain and having a hydroxy group at a terminal;
a water-soluble polymer, a water-soluble monomer, or a water-soluble oligomer as component B, the water-soluble polymer being other than the copolymer as the component A, and wherein the water-soluble polymer as the component B has a number-average molecular weight of 1000 to 400,000 and is polyvinylpyrrolidone, polyacrylic acid, polyacrylamide, polyamino acid or polyethyleneimine, and the water-soluble monomer or water-soluble oligomer as the component B is cyclodextrin or crown ether; and
a solvent as component C, the solvent containing water as a main component,
wherein the copolymer as the component A is a block copolymer of formula (1) below:

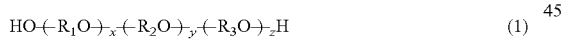   (1)

and wherein $R_1$, $R_2$ and $R_3$ are each independently an ethylene group, a propylene group, or a trimethylene group, and x, y, and z are each independently an integer of 5 to 100;
a step of forming a coating layer on a surface of the resist pattern by heating the substrate with the applied aqueous solution for resist pattern coating at 50° C. to 130° C.; and
a step of, after forming the coating layer, cooling the substrate and then removing the coating layer by etching the coating layer with an etching gas.

2. A pattern forming method comprising:
a step of forming a resist pattern by subjecting a resist layer formed on a resist underlayer film on a substrate to exposure, baking, development treatment with a developing solution, and rinsing treatment with a rinsing solution;
a step of applying an aqueous solution for resist pattern coating to coat the resist pattern without drying the resist pattern after the rinsing treatment, wherein the aqueous solution for resist pattern coating comprises:
a copolymer as component A, the copolymer having an ethylene oxide unit and a $C_3$ alkylene oxide unit in a main chain and having a hydroxy group at a terminal;
a water-soluble polymer, a water-soluble monomer, or a water-soluble oligomer as component B, the water-soluble polymer being other than the copolymer as the component A, and wherein the water-soluble polymer as the component B has a number-average molecular weight of 1000 to 400,000 and is polyvinylpyrrolidone, polyacrylic acid, polyacrylamide, polyamino acid or polyethyleneimine, and the water-soluble monomer or water-soluble oligomer as the component B is cyclodextrin or crown ether; and
a solvent as component C, the solvent containing water as a main component,
wherein the copolymer as the component A is a block copolymer of formula (1) below:

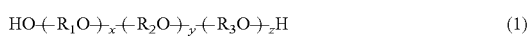   (1)

and wherein $R_1$, $R_2$ and $R_3$ are each independently an ethylene group, a propylene group, or a trimethylene group, and x, y, and z are each independently an integer of 5 to 100;
a step of forming a coating layer on a surface of the resist pattern by heating the substrate with the applied aqueous solution for resist pattern coating at 50° C. to 130° C.;
a step of, after forming the coating layer, cooling the substrate and then subjecting the coating layer to development treatment with a developing solution; and
a step of subjecting the resist pattern to rinsing treatment with a rinsing solution after subjecting the coating layer to the development treatment.

3. An inverted pattern forming method comprising:
a step of forming a resist pattern by subjecting a resist layer formed on a resist underlayer film on a substrate to exposure, baking, development treatment with a developing solution, and rinsing treatment with a rinsing solution;
a step of applying an aqueous solution for resist pattern coating to coat the resist pattern without drying the resist pattern after the rinsing treatment, wherein the aqueous solution for resist pattern coating comprises:
a copolymer as component A, the copolymer having an ethylene oxide unit and a $C_3$ alkylene oxide unit in a main chain and having a hydroxy group at a terminal;
a water-soluble polymer, a water-soluble monomer, or a water-soluble oligomer as component B, the water-soluble polymer being other than the copolymer as the component A, and wherein the water-soluble polymer as the component B has a number-average molecular weight of 1000 to 400,000 and is polyvinylpyrrolidone, polyacrylic acid, polyacrylamide, polyamino acid or polyethyleneimine, and the water-soluble monomer or water-soluble oligomer as the component B is cyclodextrin or crown ether; and
a solvent as component C, the solvent containing water as a main component, wherein the copolymer as the component A is a block copolymer of formula (1) below:

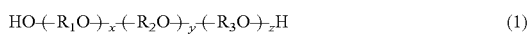   (1)

and wherein $R_1$, $R_2$, and $R_3$ are each independently an ethylene group, a propylene group, or a trimethylene group, and x, y, and z are each independently an integer of 5 to 100;

a step of forming a coating layer on a surface of the resist pattern by heating the substrate with the applied aqueous solution for resist pattern coating at 50° C. to 130° C.;

a step of, after forming the coating layer, cooling the substrate and then subjecting the coating layer to development treatment with a developing solution;

a step of applying a application solution for filling to fill pattern spaces in the resist pattern after subjecting the coating layer to the development treatment, the application solution for filling including a polysiloxane and a solvent containing water and/or an alcohol;

a step of forming an applied layer by removing, or reducing the amounts of, the developing solution and a component of the application solution for filling other than the polysiloxane;

a step of uncovering a top surface of the resist pattern by etching back the applied layer; and a step of removing the resist pattern with the top surface uncovered.

4. An inverted pattern forming method comprising:

a step of forming a resist pattern by subjecting a resist layer formed on a resist underlayer film on a substrate to exposure, baking, and development treatment with a developing solution;

a step of applying an aqueous solution for resist pattern coating to coat the resist pattern, wherein the aqueous solution for resist pattern coating comprises:

a copolymer as component A, the copolymer having an ethylene oxide unit and a $C_3$ alkylene oxide unit in a main chain and having a hydroxy group at a terminal;

a water-soluble polymer, a water-soluble monomer, or a water-soluble oligomer as component B, the water-soluble polymer being other than the copolymer as the component A, and wherein the water-soluble polymer as the component B has a number-average molecular weight of 1000 to 400,000 and is polyvinylpyrrolidone, polyacrylic acid, polyacrylamide, polyamino acid or polyethyleneimine, and the water-soluble monomer or water-soluble oligomer as the component B is cyclodextrin or crown ether; and a solvent as component C, the solvent containing water as a main component, wherein the copolymer as the component A is a block copolymer of formula (1) below:

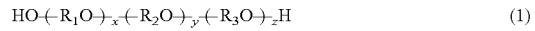

(1)

and wherein $R_1$, $R_2$, and $R_3$ are each independently an ethylene group, a propylene group, or a trimethylene group, and x, y, and z are each independently an integer of 5 to 100;

a step of forming a coating layer on a surface of the resist pattern by heating the substrate with the applied aqueous solution for resist pattern coating at 50° C. to 130° C.;

a step of, after forming the coating layer, cooling the substrate and then subjecting the coating layer to development treatment with a developing solution;

a step of subjecting the resist pattern to rinsing treatment with a rinsing solution after subjecting the coating layer to the development treatment;

a step of applying a application solution for filling to fill pattern spaces in the resist pattern without drying the resist pattern after the rinsing treatment, the application solution for filling including a polysiloxane and a solvent containing water and/or an alcohol;

a step of forming an applied layer by removing, or reducing the amounts of, the rinsing solution and a component of the application solution for filling other than the polysiloxane;

a step of uncovering a top surface of the resist pattern by etching back the applied layer; and a step of removing the resist pattern with the top surface uncovered.

* * * * *